(12) United States Patent
Cranford, Jr. et al.

(10) Patent No.: US 7,646,839 B2
(45) Date of Patent: *Jan. 12, 2010

(54) UNIFIED DIGITAL ARCHITECTURE

(75) Inventors: Hayden Clavie Cranford, Jr., Apex, NC (US); Vernon Roberts Norman, Cary, NC (US); Martin Leo Schmatz, Gallen (CH)

(73) Assignee: International Business Machines Corporation, Armonk, NY (US)

( * ) Notice: Subject to any disclaimer, the term of this patent is extended or adjusted under 35 U.S.C. 154(b) by 366 days.

This patent is subject to a terminal disclaimer.

(21) Appl. No.: 11/249,851

(22) Filed: Oct. 13, 2005

(65) Prior Publication Data

US 2006/0029177 A1 Feb. 9, 2006

Related U.S. Application Data

(63) Continuation of application No. 09/996,113, filed on Nov. 28, 2001, now Pat. No. 6,970,529.

(60) Provisional application No. 60/262,401, filed on Jan. 16, 2001.

(51) Int. Cl.
*H03D 3/24* (2006.01)

(52) U.S. Cl. .................. 375/376; 375/374; 375/375; 375/327

(58) Field of Classification Search ............ 375/376, 375/221, 222, 227, 326, 219, 327, 316, 295
See application file for complete search history.

(56) References Cited

U.S. PATENT DOCUMENTS

| | | | | |
|---|---|---|---|---|
| 4,538,282 A | * | 8/1985 | Hochschild | 375/223 |
| 4,584,695 A | * | 4/1986 | Wong et al. | 375/327 |
| 5,271,043 A | | 12/1993 | Fouche et al. | 375/115 |
| 5,504,787 A | | 4/1996 | Zscheile, Jr. et al. | 375/367 |
| 5,608,755 A | | 3/1997 | Rakib | 375/219 |
| 5,724,396 A | | 3/1998 | Claydon et al. | 375/355 |
| 5,761,210 A | | 6/1998 | Claydon et al. | 371/2.1 |
| 5,787,114 A | | 7/1998 | Ramamurthy et al. | 375/221 |
| 5,844,436 A | | 12/1998 | Altmann et al. | 327/156 |
| 5,982,836 A | | 11/1999 | Sakae et al. | 375/376 |

(Continued)

FOREIGN PATENT DOCUMENTS

EP 0 614 281 A2 11/1993

*Primary Examiner*—Chieh M Fan
*Assistant Examiner*—Qutbuddin Ghulamali
(74) *Attorney, Agent, or Firm*—James A. Lucas; Driggs, Hogg, Daugherty & Del Zoppo Co., LPA

(57) ABSTRACT

A unified, unidirectional serial link is described for providing data across wired media, such as a chip-to chip or a card-to-card interconnect. It consists of a transmit section and a receive section that are operated as pairs to allow the serial data communication. The serial link is implemented as part of a VLSI ASIC module and derives its power, data and clocking requirements from the host modules. The logic transmitter portion contains a phase locked loop (PLL), a dibit data register, a finite impulse response (FIR) filter and a transmit data register. The phase locked loop comprises both a digital coarse loop and an analog fine loop. The digital receiver portion contains a PLL, an FIR phase rotator, a phase rotator control state machine, and a clock buffer. The transmitter and the receiver each preferably utilize a pseudo-random bit stream (PRBS) generator and checker.

16 Claims, 5 Drawing Sheets

U.S. PATENT DOCUMENTS

| | | | | |
|---|---|---|---|---|
| 5,995,539 A | 11/1999 | Miller | ........................ | 375/222 |
| 6,002,714 A | 12/1999 | Huscroft | ..................... | 375/224 |
| 6,151,368 A | 11/2000 | Cochran | ..................... | 375/326 |
| 6,738,608 B2 * | 5/2004 | Black et al. | ................. | 455/260 |
| 2002/0168026 A1 * | 11/2002 | Khoini-Poorfard | .......... | 375/303 |
| 2003/0053576 A1 * | 3/2003 | Cao | ........................... | 375/375 |
| 2004/0086002 A1 * | 5/2004 | Dally et al. | ................. | 370/539 |
| 2006/0120409 A1 * | 6/2006 | Zerbe et al. | ................. | 370/516 |

* cited by examiner

UNIFIED DIGITAL ARCHITECTURE

RELATED APPLICATIONS

This application is a continuation of application Ser. No. 09/996,113, filed Nov. 28, 2001 now U.S. Pat. No. 6,970,529 B1 issued Nov. 29, 2005, which claims priority from provisional patent application Ser. No. 60/262,401, filed Jan. 16, 2001, for "Unilink Digital Architecture".

This application is related to the following copending applications, all of which are incorporated herein by reference: Ser. No. 09/996,091, filed Nov. 28, 2001, for "Architecture For Advanced Serial Link Between Two Cards"; Ser. No. 09/996,053, filed Nov. 28, 2001, for "Analog Unidirectional Serial Link Architecture"; and Ser. No. 09/997,587, filed Nov. 28, 2001, for "Apparatus And Method For Oversampling With Evenly Spaced Samples".

FIELD OF THE INVENTION

The present invention relates to the logic architecture that provides the digital functions required to enable a unified, unidirectional serial link across wired media, such as a chip-to-chip or a card-to-card interconnect.

BACKGROUND OF THE INVENTION

Serial data must be transmitted across wired media. The transmit and receive sections include chips wired to one another and card-to-card interconnects. The transmission media can be a combination of printed circuit board, connectors, backplane wiring, fiber or cable. The interconnect can include its own power, data and clocking sources or may derive these functions from a host module. Such data has typically been transmitted through a parallel data bus, such as ISA, PCI, PCI-X and the like. One drawback of such parallel links is the moderate rate of data transmission due to improved microprocessor performance, resulting in data transfer bandwidths that typically outpace I/O transfer rates. Also, the ASIC I/O count is high. In addition, the system integration I/O count using a parallel data bus is high. Finally, the overall system cost associated with the use of the parallel data bus tends to be high.

Related art shows attempts to overcome these difficulties and drawbacks by utilizing serial communication systems involving a variety of schemes. For example, some have used a carrierless amplitude/phase (CAP) modulation scheme. Others have used linear compression/decompression and digital signal processing techniques for frequency modulation. Still others use a linear (analog) phase rotator to recover only the carrier of an incoming signal. Some transmit using a pass band which limits the bandwidth of the frequencies being passed, rather than a baseband channel wherein the signals are not shared and the frequencies are not restricted.

BRIEF DESCRIPTION OF THE INVENTION

A unified digital architecture comprises a logic transmitter portion and logic receiver portion. The logic transmitter portion contains a phase locked loop (PLL), a dibit data register, a finite impulse response (FIR) filter and a transmit data register. It also uses a pseudo-random bit stream (PRBS) generator and checker. The digital receiver portion contains a PLL, a FIR phase rotator, a phase rotator control state machine and a clock buffer. It can also include a pseudo-random bit stream (PRBS) generator and a checker for diagnostics.

The invention comprises a unified serial link system and method for transmitting digital data across wired media including a transmitter and a receiver. The transmitter PLL comprises a dual loop phase locked loop control circuit having a digital coarse loop and an analog fine loop. The transmitter PLL contains a four-stage voltage controlled oscillator adapted to run at full bit frequency. The coarse loop includes a reference generator, a voltage comparator, a PLL control logic, a digital to analog counter and a low pass filter. The fine loop includes the oscillator, a 4×-frequency divider, a phase-frequency detector, a charge pump and a loop filter. The transmitter contains a random bit stream generator. The receiver includes a dual loop PLL phase locked loop control circuit and an over sampled half-rate system with a multi-step phase rotation, controlled by a signal generated by an early/late comparator.

DETAILED DESCRIPTION OF THE INVENTION

Figure 1:
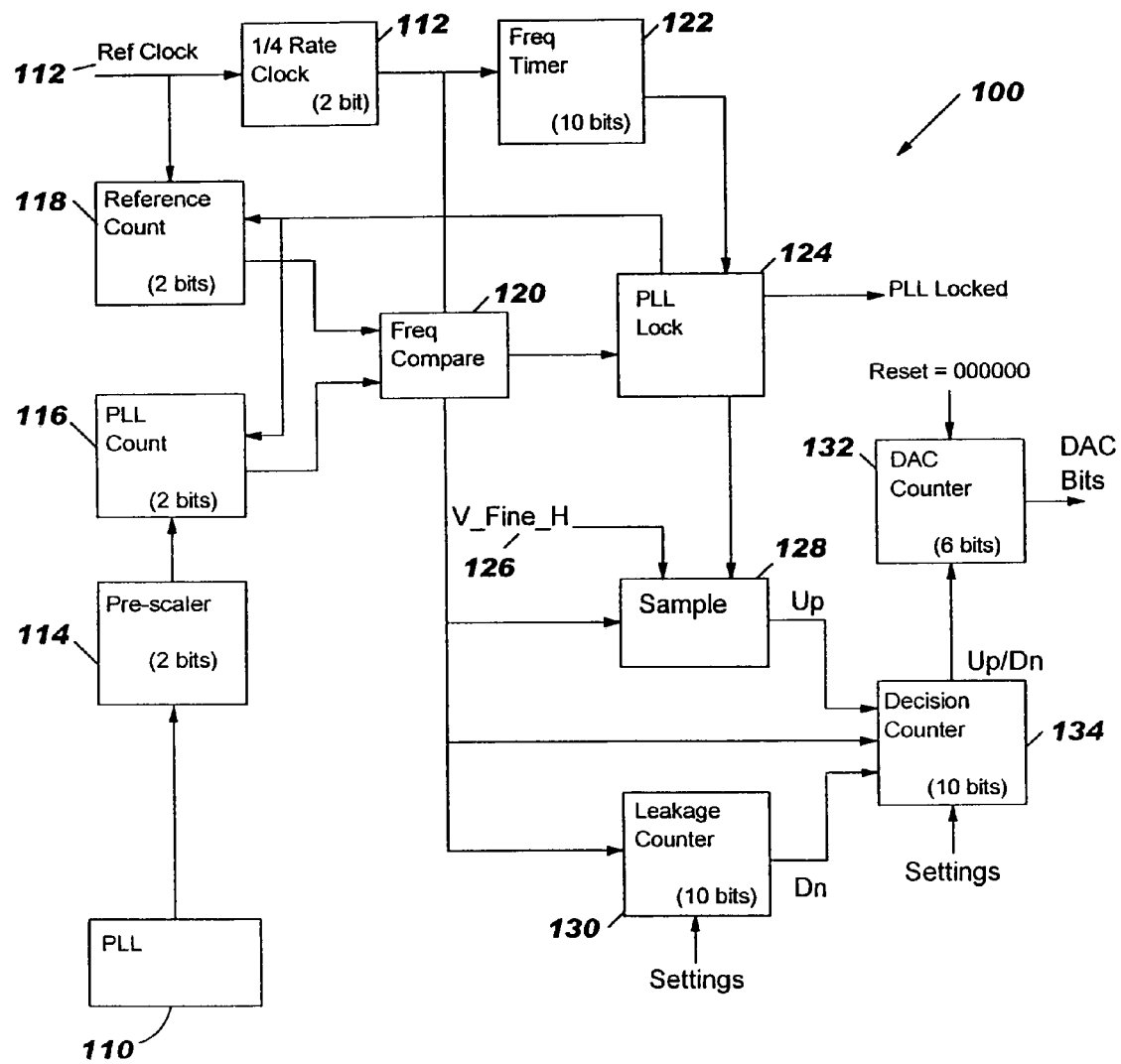
FIG. 1 is an illustration of the control circuit for a phased lock loop.

The PLL control architecture is intended to provide the coarse PLL control loop for a dual-loop PLL. Lock is determined by comparing two Grey counters running on the reference and PLL clocks. The digital to analog conversion (DAC) bits, which set the coarse control voltage for the PLL, are controlled by monitoring a signal from the PLL (V_Fine_H) which indicates which half of its operating range it is in. FIG. 1 illustrates the PLL control circuit.

More specifically, FIG. 1 shows a full data rate PLL 110. This PLL is the clock source for the transmitted data and runs at the full data rate of e.g. 2 to 3 Gbps. A stable frequency from a reference clock 112 is required for determining if the PLL is locked to its correct frequency. The clock 112 operates at one-fourth of the full data rate. For example, a 625 Mhz clock rate is used for an operational data rate of 2.5 Gbps. A single clock phase is buffered, is brought out of the PLL, and is used to drive into a phase buffer circuit.

The PLL contains a four-stage voltage controlled ring oscillator (VCO), a 4X frequency divider, phase-frequency detector, charge pump and loop filter. These elements form the "fine" control loop. The VCO has both a 'fine' analog and a 'course' digital control voltage in order to minimize the required gain of the fine loop. The VCO is capable of changing the speed of oscillation by adjusting the local feedback within a delay cell, as well as controlling feedback within the VCO for speed enhancement. In addition to the fine control loop elements, the PLL 110 contains a reference generator, a voltage comparator, PLL control logic, a low-pass filter and a digital to analog counter 132. These elements form the coarse control loop.

The fine control loop is a conventional analog loop and is intended to provide a stable, low-noise, low-jitter clock source for the transmitter. The details of the fine control loop are well known in the art and do not by themselves comprise any part of the present invention.

The coarse control loop is a digital representation of a conventional analog control loop based on a 'leaky' loop filter capacitor. This type of loop relies on leakage from the loop filter cap to drive the control voltage in a particular direction regardless of the frequency of the VCO. A phase detector and charge pump that only increases the charge on the filter cap compensates this leakage. The loop is stable when the charge being added to the cap balances the charge that is leaking.

A signal from the reference source 112 is fed into a reference counter 118. A pre scaler 114 divides the frequency to one-fourth. A frequency comparator 120 matches the frequency from the PLL counter 116 with that of the reference counter 118 to determine if the PLL 110 and the reference clock 112 are running at the same frequency and are counting at the same rate. The two counters 116, 118 are compared over a period of time, e.g. 10-bit count, as determined by the frequency timer 122. Over this 10-bit count, if the comparator determines that the counted values are maintaining a fixed distance from one another, the comparator 120 then confirms that the PLL 110 is locked. The PLL lock 124 monitors the output of the frequency timer. Every time the frequency timer 122 reaches its maximum count, the PLL counter 116 and the reference counter 118 are reset. Thus, this comparison is performed each time the frequency timer 122 times out. If, during the interval, the two counters 116, 118 have not compared to one another or the frequency comparator 120 has not become true, this assumes that the clocks are locked because the counters are not catching up with one another. If, however, the frequency timer 122 times out and a frequency comparator 120 has compared the reference count and the PLL count, it declares that the PLL is unlocked. These two counters are reset if the frequency timer 122 declares that the PLL is unlocked.

A V_fine_H signal 126 is introduced from the analog section of the transmitter and indicates that the fine loop is at the center of its range. When the PLL locks and the fine loop is centered, the signal can move up and down from the center with some degree of latitude. This then allows for perturbations of the system, such as temperature changes. The signals from the PLL and the fine loop are asynchronous and go to the sample latch 128. If the V_fine_H signal is not on and the PLL lock signal is not on, then an 'up' signal is applied. This causes the decision counter 134 to count up, thereby causing the DAC counter 132 to also count up. When both of these conditions are met, the system stops counting up.

The DAC counter is a binary search counter with 64 possible steps counting up from 000000 to 111111. The counter steps through all of the different settings until it finds a setting where the PLL will lock.

The PLL control logic in the coarse control loop has an up/down counter 130, the value of which represents the charge on the loop filter cap. This counter 130 is slowly decremented to represent leakage. The voltage comparator is high or low depending on whether the fine control voltage is operating in the upper or the lower half of its range. To balance the leakage, the control logic samples the comparator output. After multiple samples showing upper range operation, the up/down counter is incremented to represent adding charge to the loop filter cap. The DAC and low-pass filter convert the up/down counter output to a control voltage. The coarse control loop is intended to compensate for manufacturing process variations and relatively low frequency but large changes due to power supply and temperature drift.

The transmit phase buffer consists of circuits which are designed to interface to the pre-drive section of the PLL and provide only light loading to the PLL. The phase buffer then drives out to a latch providing the clock necessary for a full rate design. The phase buffer must also provide adequate rise and fall times, taking into account the estimated net loadings.

The driver/equalizer consists of current-mode differential drive circuits which are controlled by a finite impulse response (FIR) type filter function. This filter is implemented by the combination of a shift register containing the current outgoing data bit and a history of three previous bits. This shift register, in turn, controls the activation of weighted current drivers. The output transfer function is of the general form of $H(Z)=Ab_0+Ab_1Z^{-1}+Ab_2Z^{-2}+Ab_3Z^{-3}$ wherein the values of the $b_n$ coefficients are negative. The numerical values of the coefficients are set by register values in the logic. The determining factors for the values of these coefficients include the characteristics of the transmission, media, the speed of transmission, the type of board connector used, the type of chip package, etc. The data bits are fed to the transmitter after the necessary conversion to the differential signal form and the powering up that is required to control the driver.

Figure 2:
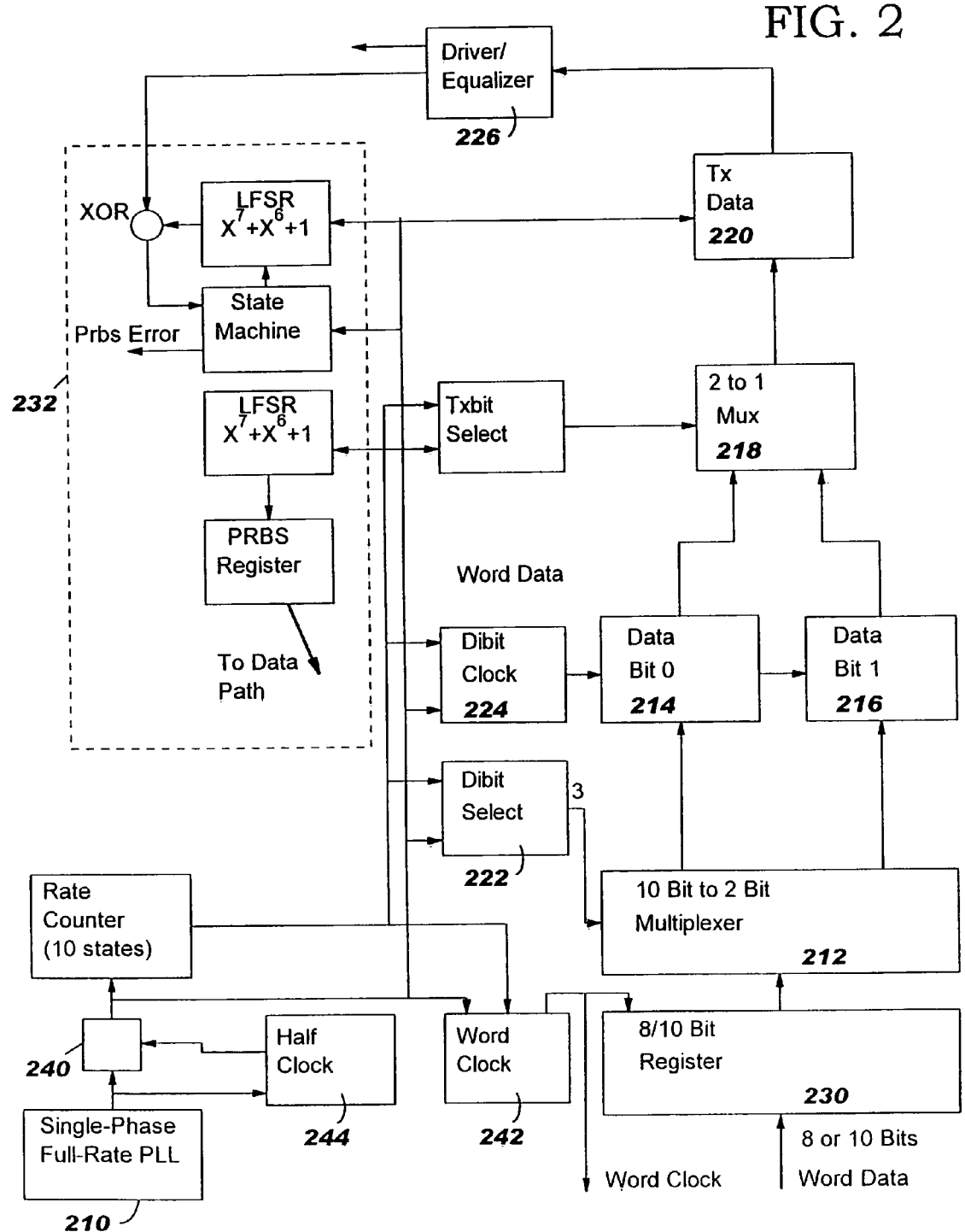
FIG. 2 is a block diagram of the transmitter architecture of the present invention.

The transmitter architecture is a multiplexing full-rate system. It is supported by three major analog blocks: a full data rate PLL, a phase buffer to repower the PLL signal for the driver, and an off-chip driver with a built-in pre-emphasis equalization. In addition, there are specialized circuits for testing of the PLL. FIG. 2 shows a block diagram of the transmitter architecture. A PLL 210 is controlling a four-stage ring oscillator 240 running at the full bit frequency. This PLL is shared by four transmitters. The phase outputs are used as local recovered clocks and to clock the FIR section of the driver. Word data (eight or ten bits) is clocked into a register synchronously with a word clock 242 generated from the PLL clock. The word data is transferred two bits at a time to a dibit data register 230 which is then loaded one bit at a time into the transmit data register. The final output is transferred at the full bit rate to the driver/equalizer block 226. The transmitter also contains a pseudo-random bit stream (PRBS) generator and checker 232, which allows for self-testing in a wrap mode as well as link testing with a corresponding receiver.

In more detail, the transmitter structure takes eight or ten bit data from the dibit data register 230 and synchronously transfers the data two bits at a time through a bit selector 212 to a first holding latch 214 and a second holding latch 216. The bit selector 212 processes the two bit data pair by the least significant bit first, followed by the next lower significant bit. The counter 222 tracks the number of pairs that are processed and the order of each bit in the pair. When the counter senses that all bit-pairs have been serialized, the interfacing logic is notified to send another word for processing and the eight bit/ten bit register is clocked to latch the new data to be processed. The contents of the first and second latches 214, 216 are transferred in an alternating fashion under the control of dibit clock 224 to a dibit data register 218 and then to a single latch 220. A bit stream from this single latch 220 is transmitted to a driver/equalizer 226. This device takes the bit stream and creates a current-mode differential signal that is frequency equalized for the assumed media channel. The equalization is a finite impulse response (FIR) pre-emphasis type using reduced current levels for longer run lengths.

The driver equalizer consists of current-mode differential drive circuits which are controlled by the FIR filter function commonly employed for this purpose. The filter is implemented by the combination of a shift register containing the current outgoing data bit and a history of the three most recent bits of outgoing data. The shift register, in turn, controls the activation of weighted current drivers.

The receiver architecture is a three fold, oversampled, half-rate system with a 54-step phase rotator, advanced digital bang-bang control circuit and an implementation of a sample processing algorithm centering the static edge in the middle between two samples. The receiver takes an NRZ encoded baseband signal from the transmitter and aligns the edges to determine where the signal switches between '1's and '0's. As with other signals, the problem is placing the center point between the edges. This is a achieved by sampling the signal and generating early or late signals based on whether the signal is being sampled too early or too late. When the frequency of the 'up' pulse is more than that of the 'down' pulse, the system drifts in the 'up' direction. Conversely, it drifts in the 'down' direction when the frequency of the down pulse is greater than that of the 'up' pulse.

The phase adjustment and clock recovery is done by a phase rotating device, and not by using a PLL or delay locked loop (DLL). If there is more than one analog PLL or DLL on one chip, these circuits tend to interact via supply and/or substrate coupling. It would, therefore, be difficult to control their phases/delay in an analog fashion. The use of an independent PLL clock generator and an external phase rotator makes the system more immune against injected noise. The control of the phase shift is digital. The system operates at half the bit rate. For analysis of edges and data, however, three bit intervals are used in order to have a half bit overlap on both sides. Some of the actual samples are reused in the following analysis cycle. The rotator control state machine has a 'fly wheel' function. It monitors the phase update rate and applies an update even if no edge information was measured. This allows a TX to RX frequency offset even with very long (>1024 bit) run length if the jitter of the two clocks is small enough.

The receiver analyzes the oversampled data stream and generates two sets of correlation output signals: the detected bit values and the early and late signals for an eventual update of the phase rotator. The early/late signals are generated by use of edge and data correlation tables of the type shown and described in copending patent application Ser. No. 09/997,587, filed Nov. 28, 2001, for "Apparatus And Method For Oversampling With Evenly Spaced Samples". These tables provide a pattern recognition algorithm that serves to specify the early and late signals as a function of the input sample pattern. When the detected bit edge is centered between two samples, there is a 'dead-zone' in the clock and data recovery (CDR) control loop if no jitter is present. With a jitter number larger than the sample spacing, the loop will average the detected sample crossings and will position the edge in the middle between two samples. This is a different situation than that found in a PLL phase detector with a dead zone, because the jitter is much larger and the phase control is digital with no leakage effects. The probability of generating a metastable sampling output is reduced for a middle edge position because the probability of an edge being positioned right on a sample is reduced.

The phase rotator control state machine processes the early and late outputs from the edge correlation outputs to control the phase settings of the phase rotator.

Figure 3:
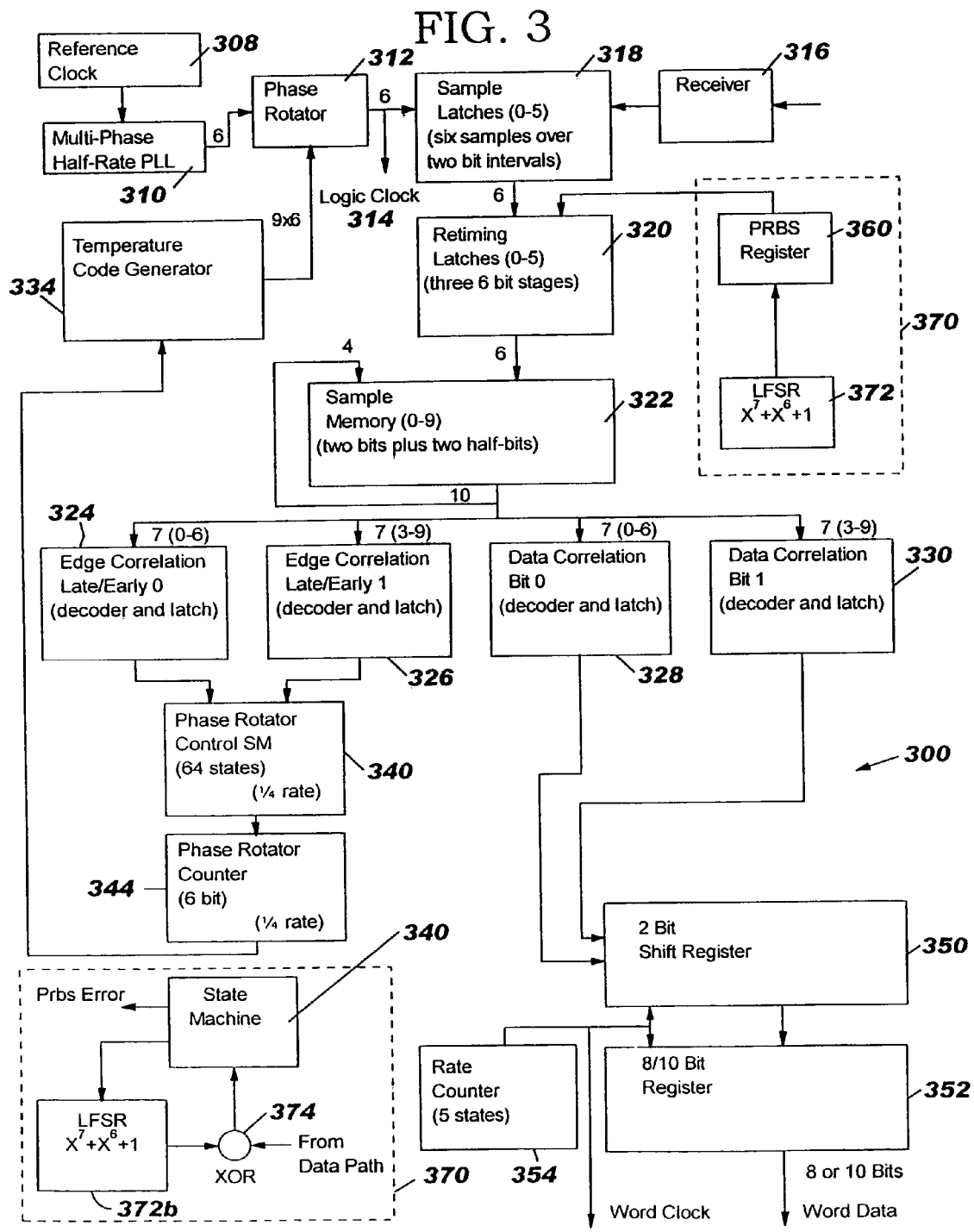
FIG. 3 is a block diagram of the receiver architecture of the present invention.

FIG. 3 illustrates a block diagram of the receiver architecture. A PLL 310 receives a signal from a reference clock 308. The PLL controls a voltage controlled three-stage ring oscillator (VCO) running at half the bit frequency. The PLL is shared with four receivers, one, 316 being shown. The six phases from the VCO are fed into a phase rotator 312 having 54 steps for a 2p interval. The 54 steps are generated with a phase rotator having six phases with three inter-slice phase steps further divided by three.

The six outputs of the rotator 312 are buffered, and the edges are shaped to be able to sample a signal having twice the frequency. One of the phase outputs is used as local recovered clock 314. A clock buffer makes sure that it is not overloading the phase rotator. Timing analysis determines which phase is the optimum to use. The output section of the phase rotator suppresses common mode signals and performs a limiting signal.

The output is then driven out (with the signals from the phase rotator) to the phase buffers and to a sample latch complex 318 which in turn provides clocks. Six samples are taken over a two-bit interval. The sample latch complex is a CMOS, positive edge triggered latch. It takes differential data inputs and, with a single ended clock, outputs a single ended logic level signal. The complex consists of two circuits, the latch itself and a buffer that sharpens the output to the receive logic. The retiming latches 320 add three pipeline stages from the pseudo random bit stream (PRBS) register 360 in order to reduce the probability of a metastable state to a value much lower than the targeted bit error rate. It is also helping to align the data to one single clock phase. In order to be able to process information from more than one bit interval for the recovery of one data bit, a memory stage 322 reuses four samples from the previous sampling period. A total of ten samples is, therefore, fed into the half rate edge and data detection correlation blocks 324, 326, 328, 330 that make use of a pattern recognition algorithm. Truth tables represent the initial best guess for the data.

The outputs of the edge and data detection block are the recovered two bit and the early and late signals going to the phase rotator control state machine 340. This involves the use of a bang-bang control circuit with adaptive step size. The state machine can be viewed as a digital filter that evaluates the early and late signals and commands an adjustment of the sample point. The rotator counter and temperature code generator 334 generates the 54 control signals for the phase rotator, and this closes the CDR loop.

The data path consists of a shift register 350 which loads two bits from the data correlation blocks during each half-rate cycle. The shift register is loaded to a word data register 352 (eight or ten bits) using a word clock derived from the PLL clock. A rate counter 354 monitors the shift register 350 and the eight/ten bit register 352.

Figure 4:
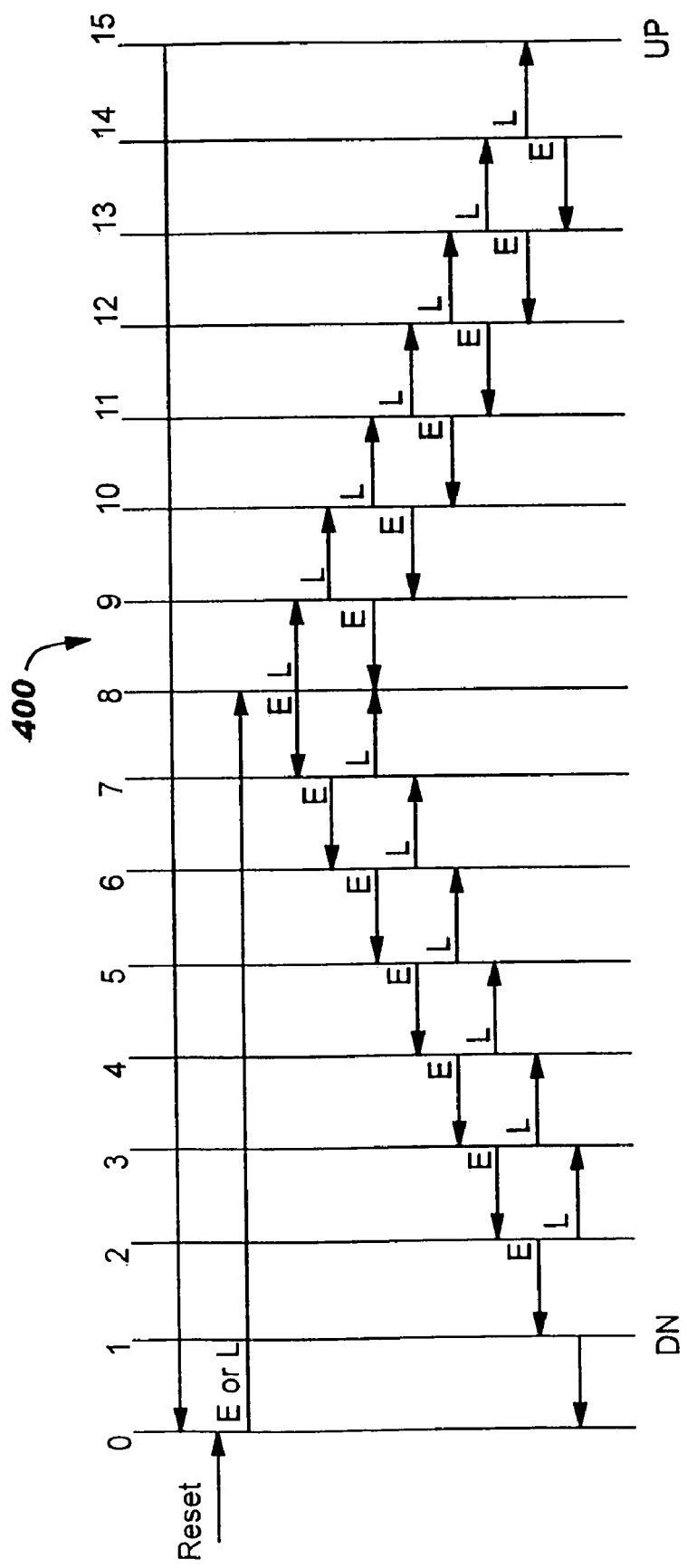
FIG. 4 shows an averaging pattern for a phase rotator control.

The receiver also contains a pseudo-random bit stream (PRBS) generator and checker which allows for self-testing in a wrap mode as well as link testing with a corresponding transmitter. The checker comprises a linear feedback shift register (LFSR) 372a which generates a random pattern. This pattern is sent through the receiver. This same pattern is regenerated in a second LFSR 372b. With the XOR, the regenerated pattern is compared with the data passing through the receiver. Both of these registers 372a, 372b are part of the PRBS function The method for the phase rotator control is an advanced bang-bang state machine. As seen in FIG. 4, it involves eight-fold initial early/late averaging. It has sixteen states and may be implemented using four latches. The state machine 340 (FIG. 3) has two inputs, one for early and one for late. The averaging effect is achieved in the following manner. The state machine is set to eight. If several early signals in a row, but not enough to drive the state to '1', are followed by several late signals, the state machine averages them out. However, when a preponderance of early or late signals takes the state machine to '1' or '14', the state machine determines that the sampling is occurring too early or too late and determines whether to change the sample point. The state machine produces a 'down' signal when it gets to a state '1', and an 'up' signal when it gets to a state '14'. This output signal from the state machine, if it is a 'down', instructs the rotation counter to adjust the sampling to a later point. Conversely, an 'up' signal will instruct the counter to adjust the sampling to an earlier point.

The bang-bang control state machine is followed by an up and down counter with 54 steps (requiring six flip-flops) for the receiver with sample processing. The counter has 54 steps and controls where the sample point will be. The counter processes two bits at a time in parallel. Thus, there are twenty-seven positions where the sample point can be set for each bit. That defines the limits of the resolution. As noted, the state machine determines whether to change the sample point and the counter determines where the new sample point will be.

Figure 5:
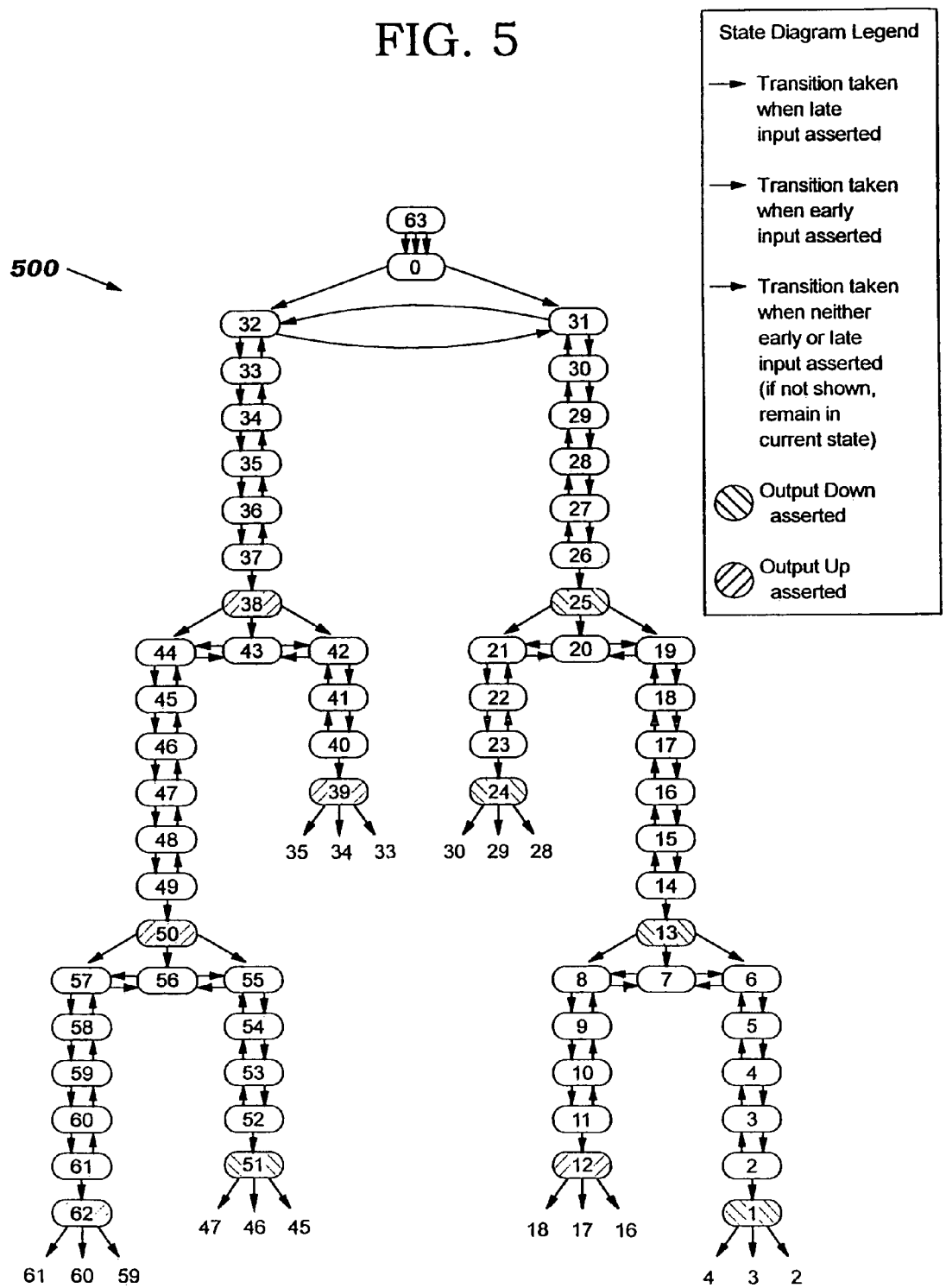
FIG. 5 shows another embodiment of an averaging pattern for a phase rotator control.

FIG. 5 shows the operation of a second embodiment of the state machine. This machine 500 combines early/late averaging with adaptive behavior that changes the amount of averaging based on the number of consecutive early or late inputs. When a sustained sequence of early or late inputs is received, this state machine reduces the amount of averaging in order to increase the stepping rate for the phase rotator. This state machine contains 64 states and requires 6 latches. As with the prior embodiment, the state machine is followed by an up and down counter with 54 steps requiring six flip-flops.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A unified serial link system for transmitting digital data across wired media including a transmitter and a receiver, comprising:
   the transmitter including a dual loop phase locked loop control circuit having a digital coarse loop for providing a full data rate phased lock loop (PLL) frequency control signal to an analog fine loop; and
   the receiver including a phase locked loop control circuit and an over sampled half rate system, the receiver further comprising a signal edge comparator including a sample processing algorithm for centering a static edge of a signal in the middle between two signal samples, a bit edge correlation table for generating early and late signals based on the output of the comparator, and a multi-step phase rotator controlled by the generated signal.

2. The system according to claim 1 wherein the PLL in the transmitter is adapted to operate at full data rate and contains a four-stage voltage controlled oscillator adapted to run at full bit frequency.

3. The system according to claim 1 including a frequency reference clock that runs at one-fourth of the full data rate, and a comparator that compares the frequency of the PLL with the frequency of the reference clock.

4. The system according to claim 1 wherein the coarse loop includes a reference generator, a voltage comparator, a PLL control logic, a digital to analog counter and a low pass filter.

5. The system according to claim 1 wherein each of the transmitter PLL and the receiver PLL contains a pseudo random bit stream generator and checker for wrap mode self-testing.

6. The system according to claim 1 wherein a phase rotator control state machine is used to process the early and late signals from the correlation table to control the phase settings of the phase rotator.

7. The system according to claim 6 wherein the receiver phase rotator is independent of the receiver PLL, and is employed for the purpose of making phase adjustments and clock recovery.

8. The system according to claim 1 wherein the receiver PLL controls a voltage controlled oscillator, and the output phases of the oscillator are fed to the phase rotator.

9. The method of transmitting digital data across wired media between a transmitter and a receiver, comprising:
   providing a transmitter with a phase locked loop control circuit having a digital coarse loop and an analog fine loop;
   providing a full data rate PLL frequency control signal from the coarse loop to an analog fine loop; and
   providing a receiver including a phase locked loop control circuit and providing an over sampled half-rate system, the receiver further comprising a signal edge comparator, a bit edge correlation table including a sample processing algorithm for centering a static edge of a signal in the middle between two signal samples, a bit edge correlation table for generating early and late signals, a correlation table, and a multi-step phase rotator controlled by the generated signal.

10. The method according to claim 9 wherein the PLL in the transmitter operates at full data rate and contains a four-stage voltage controlled oscillator running at full bit frequency.

11. The method according to claim 9 including a frequency reference clock that runs at one-fourth of the full data rate, and a comparator that compares the frequency of the PLL with the frequency of the reference clock.

12. The method according to claim 9 wherein the coarse loop further utilizes a reference generator, a voltage comparator, a PLL control logic, a digital to analog counter and a low pass filter.

13. The method according to claim 9 wherein each of the transmitter PLL and the receiver PLL uses a pseudo random bit stream generator and checker for wrap mode self-testing.

14. Method according to claim 9 wherein a phase rotator control state machine processes the early and late signals from the correlation table to control the phase settings of the phase rotator.

15. The method according to claim 14 wherein the receiver phase rotator is independent of the receiver PLL, and is employed for the purpose of making phase adjustments and clock recovery.

16. The method according to claim 9 wherein the receiver PLL controls a voltage controlled oscillator, and the output phases of the oscillator are fed to the phase rotator.

* * * * *

UNITED STATES PATENT AND TRADEMARK OFFICE
CERTIFICATE OF CORRECTION

PATENT NO. : 7,646,839 B2
APPLICATION NO. : 11/249851
DATED : January 12, 2010
INVENTOR(S) : Cranford, Jr. et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 553 days.

Signed and Sealed this

Sixteenth Day of November, 2010

David J. Kappos
*Director of the United States Patent and Trademark Office*